(12) United States Patent
Corum et al.

(10) Patent No.: US 8,502,537 B2
(45) Date of Patent: Aug. 6, 2013

(54) ADIABATIC MAGNETIZATION PREPARATION FOR B1 AND B0 INSENSITIVE HIGH CONTRAST MRI

(75) Inventors: Curtis A. Corum, Shoreview, MN (US); Steen Moeller, Golden Valley, MN (US); Djaudat S. Idiyatullin, New Brighton, MN (US); Michael G. Garwood, Medina, MN (US)

(73) Assignee: Regents of the University of Minnesota, St. Paul, MN (US)

( * ) Notice: Subject to any disclaimer, the term of this patent is extended or adjusted under 35 U.S.C. 154(b) by 556 days.

(21) Appl. No.: 12/752,633

(22) Filed: Apr. 1, 2010

(65) Prior Publication Data
US 2010/0253340 A1  Oct. 7, 2010

Related U.S. Application Data

(60) Provisional application No. 61/166,067, filed on Apr. 2, 2009.

(51) Int. Cl.
*G01V 3/00* (2006.01)

(52) U.S. Cl.
USPC ........................................................ 324/314

(58) Field of Classification Search
USPC .................. 324/300–322; 600/410–435
See application file for complete search history.

(56) References Cited

U.S. PATENT DOCUMENTS

| | | | |
|---|---|---|---|
| 4,551,680 A * | 11/1985 | Macovski | 324/309 |
| 4,695,799 A | 9/1987 | Hardy et al. | |
| 4,914,392 A | 4/1990 | Ugurbil et al. | |
| 5,189,371 A * | 2/1993 | Conolly et al. | 324/309 |
| 5,214,382 A * | 5/1993 | Harms et al. | 324/309 |
| 6,064,203 A * | 5/2000 | Bottomley | 324/309 |
| 6,091,240 A * | 7/2000 | Smith et al. | 324/300 |
| 6,100,688 A * | 8/2000 | Smith et al. | 324/300 |
| 6,166,541 A * | 12/2000 | Smith et al. | 324/300 |
| 6,222,364 B1 * | 4/2001 | Smith et al. | 324/300 |
| 6,603,989 B1 | 8/2003 | Yablonskiy | |
| 7,180,287 B2 * | 2/2007 | Rottengatter et al. | 324/303 |
| 7,256,579 B2 * | 8/2007 | Sood | 324/307 |
| 7,375,520 B2 | 5/2008 | Nezafat et al. | |
| 7,425,828 B2 | 9/2008 | Garwood et al. | |
| 8,067,936 B2 * | 11/2011 | Garwood et al. | 324/307 |
| 8,148,982 B2 * | 4/2012 | Witschey et al. | 324/309 |
| 2005/0248342 A1 * | 11/2005 | Rottengatter et al. | 324/303 |

FOREIGN PATENT DOCUMENTS

WO  WO-2010/114608 A1  10/2010

OTHER PUBLICATIONS

"International Application Serial No. PCT/US2010/000976, International Preliminary Report on Patentability mailed Oct. 13, 2011", 12 pgs.

"International Application Serial No. PCT/US2010/000976, International Search Report mailed Jun. 30, 2010", 5 pgs.

"International Application Serial No. PCT/US2010/000976, Written Opinion mailed Jun. 30, 2010", 12 pgs.

(Continued)

*Primary Examiner* — Dixomara Vargas
(74) *Attorney, Agent, or Firm* — Schwegman, Lundberg & Woessner, P.A.

(57) ABSTRACT

A magnetic resonance image is produced by radial imaging using one or more preparatory pulses. The magnetic preparation pulse can include one or more adiabatic pulses.

4 Claims, 4 Drawing Sheets

OTHER PUBLICATIONS

Blume, U., et al., "Comparison of long-T2 suppression techniques for 3D Ultrashort Echo-Time Imaging", *Proc. Intl. Soc. Mag. Reson. Med., 14.* (2006), p. 3028.

Corum, C A, et al., "Progress in 3d Imaging at 4 T with SWIFT", *Proc. Intl. Soc. Mag. Reson. Med., 16.* (2008), p. 1330.

Corum, C. A, et al., "MP-SWIFT with adiabatic inversion preparation for quiet,B1 insensitive T1 weighted imaging.", *Proc. Intl. Soc. Mag. Reson. Med., 17,* (2009), p. 2772.

Corum, C. A., et al., "Progress in Rapid and Short Acquisition Delay Imaging with SWIFT", *Proc. Int. Soc. Mag. Reson. Med., 15,* (2007), p. 1670.

Ellermann, J., et al., "The ultrastructure of bone using selective saturation in SWIFT at 9.4 T", *Proc. Intl. Soc. Mag. Reson. Med., 17,* (2009), p. 849.

Idiyatullin, D, et al., "Sweep Imaging with Fourier Transform (SWIFT)", *Proc. Intl. Soc. Mag. Reson. Med., 14,* (2006), p. 2433.

Ikonomidou, V. N., et al., "Sequence optimization for Ti-based tissue separation", *Proc. Intl. Soc. Mag. Reson. Med., 11,* (2004), p. 2238.

Larson, P. E. Z., et al., "Using Adiabatic Inversion Pulses for Long-$T_2$ Suppression in Ultrashort Echo Time (UTE) Imaging", *Magnetic Resonance in Medicine, 58,* (2007), 952-961.

Madelin, G., et al., "Double Inversion Recovery MRI with Fat Suppression at 3T and 7T", *Proc. Intl. Soc. Mag. Reson. Med., 16,* (2008), p. 1328.

Mugler III, J. P., et al., "Three-Dimensional Magnetization-Prepared Rapid Gradient-Echo Imaging (3D MP RAGE)", *Magnetic Resonance in Medicine, 15 (1),* (1990), 152-157.

Van De Moortele, P.-D., et al., "$T_1$ weighted brain images at 7 Tesla unbiased for Proton Density, $T_2^*$ contrast and RF coil receive $B_1$ sensitivity with simultaneous vessel visualization", *NeuroImage, 46(2),* (2009), 432-446.

\* cited by examiner

Fig. 6

ADIABATIC MAGNETIZATION PREPARATION FOR B1 AND B0 INSENSITIVE HIGH CONTRAST MRI

CLAIM OF PRIORITY

This patent application claims the benefit of priority, under 35 U.S.C. Section 119(e), to Curtis A. Corum et al., U.S. Provisional Patent Application Ser. 61/166,067, entitled "ADIABATIC MAGNETIZATION PREPARATION FOR B1 AND $B_0$ INSENSITIVE HIGH CONTRAST MRI," filed on Apr. 2, 2009. U.S. Provisional Patent Application Ser. 61/166,067 is incorporated herein by reference.

STATEMENT REGARDING FEDERALLY SPONSORED RESEARCH OR DEVELOPMENT

This invention was made with government support under award number BTRR P 41 RR008079 from the National Institutes of Health (NIH). The government has certain rights in this invention.

BACKGROUND

Under certain circumstances, images generated using magnetic resonance can exhibit inadequate contrast or signal to noise ratio. Present systems do not provide the contrast and signal to noise ratio needed.

OVERVIEW

The present subject matter includes methods and systems for generating uniformly high contrast magnetic resonance (MR) images using inhomogeneous $B_1$ and $B_0$ fields. The present subject matter is suitable for generating a $T_1$ weighted image and for generating an image that is $T_2$ weighted and $B_1$ insensitive.

Magnetization preparation entails delivering a preparatory pulse (or pulses) prior to data acquisition. These pulses are sometimes called MP-RAGE or IR-Prepared Fast SPGR.

An example of the present subject matter may be suitable for high field MRI, for low-cost inhomogeneous magnet MRI, for single sided MRI, or for applications to EPR.

Existing technology was designed for low field homogeneous $B_0$ and $B_1$ fields. Cost effective strategies to provide uniform contrast in inhomogeneous $B_1$ and $B_0$ environments is becoming increasingly important for emerging high field systems and for novel MRI systems.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Part 1 includes a description of an example of a magnetic resonance system. Part 2 describes an example of the SWIFT imaging protocol. Part 3 describes magnetization preparation and discusses an example MP pulse. Part 4 includes a description of MP-SWIFT with adiabatic inversion preparation for quiet, $B_1$ insensitive $T_1$ weighted imaging. Part 5 includes a description of adiabatic $T_2$ weighted MP-SWIFT in brain at 4 T. Part 6 describes a method according to one example.

Part 1

Figure 1:
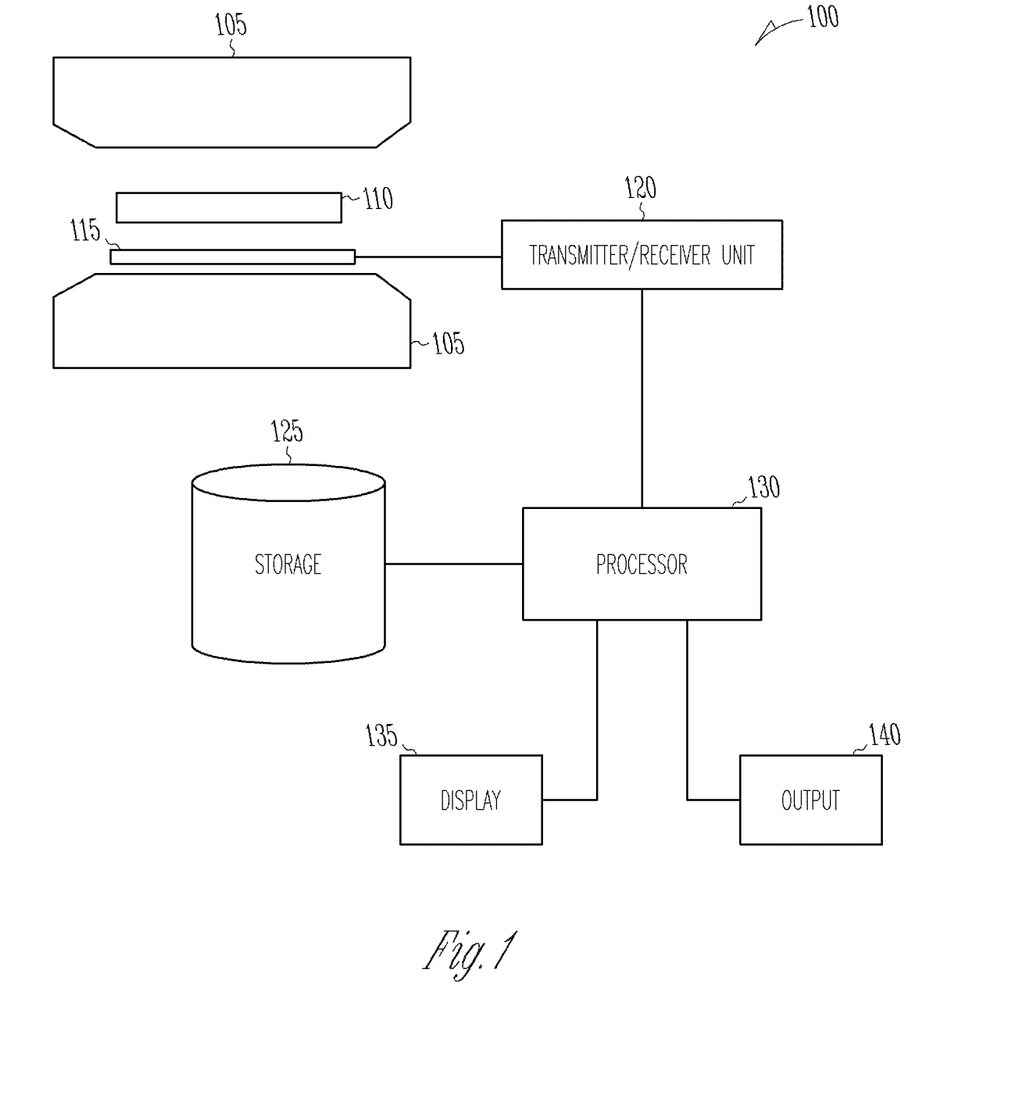
FIG. 1 includes a magnetic resonance system according to one example.

FIG. 1 includes a block diagram of magnetic resonance system 100. Magnetic resonance system 100, in one example, depicts an imaging system 100 having magnet 105. In one example, system 100 includes an electron paramagnetic resonance system. Magnet 105 can provide a biasing magnetic field. Coil 115 and subject 110 are positioned within the field of magnet 105. Subject 110 can include a human body, an animal, a phantom, or other specimen. Coil 115, sometimes referred to as an antenna, can include a transmit coil, a receive coil, a separate transmit coil and receive coil, or a transceiver coil. Coil 115 is in communication with transmitter/receiver unit 120 and with processor 130. In various examples, coil 115 both transmits and receives radio frequency (RF) signals relative to subject 110. Transmitter/receiver unit 120 can include a transmit/receive switch, an analog-to-digital converter (ADC), a digital-to-analog converter (DAC), an amplifier, a filter, or other modules configured to excite coil 115 and to receive a signal from coil 115. Transmitter/receiver unit 120 is coupled to processor 330.

Processor 130 can include a digital signal processor, a microprocessor, a controller, or other module. Processor 130, in one example, is configured to generate an excitation signal (for example, a pulse sequence) for coil 115. Processor 130, in one example, is configured to perform a post-processing operation on the signal received from coil 115. Processor 130 is also coupled to storage 125, display 135 and output unit 140.

Storage 125 can include a memory for storing data. The data can include image data as well as results of processing performed by processor 130. In one example, storage 125 provides storage for executable instructions for use by processor 130. The instructions can be configured to generate and deliver a particular pulse sequence or to implement a particular algorithm.

Display 135 can include a screen, a monitor, or other device to render a visible image corresponding to subject 110. For example, display 135 can be configured to display a radial projection, a Cartesian coordinate projection, or other view corresponding to subject 110. Output unit 140 can include a printer, a storage device, a network interface or other device configured to receive processed data.

Part 2

In nuclear magnetic resonance (NMR, also abbreviated as magnetic resonance, MR), RF excitation can be described as sequential, simultaneous, and random. Three different corresponding NMR techniques are used, including continuous wave (CW), pulsed, and stochastic.

Pulsed FT spectroscopy can be used with high resolution NMR. MRI has additional technical requirements over high resolution NMR. Because the objects of interest are much larger than a test tube, inevitably the static and RF fields used in MRI are more inhomogeneous than those used in high resolution NMR.

As in CW, the SWIFT method uses RF sweep excitation and uses a sweep rate that exceeds the sweep rate of the CW method by more than a few orders of magnitude. Unlike the CW method in which the signal is acquired in the frequency domain, in SWIFT, the signal is considered as a time function, as in the pulsed FT method. In addition, SWIFT uses the correlation method similar to stochastic NMR in order to extract proper spectral information from the spin system response.

The rapid-scan FT technique and SWIFT technique have some common properties but are different in point of view to system response on excitation. Rapid-scan FT considers the system response in the frequency domain and SWIFT considers the system response in the time domain. As a result, the spectra obtained using SWIFT is insensitive to the linearity of the sweep rate. This permits use of a broad class of frequency modulated pulses having more uniform excitation profiles than the chirp excitation required in rapid-scan FT. SWIFT also provides virtually simultaneous excitation and acquisition of signal. Accordingly, SWIFT has a "zero echo time", and so is well-suited for studying objects having very fast spin-spin relaxation (or very short $T_2$). SWIFT can be used for MRI of quadrupolar nuclei, such as sodium-23, potassium-39, and boron-11.

SWIFT Methodology

Figure 2A:
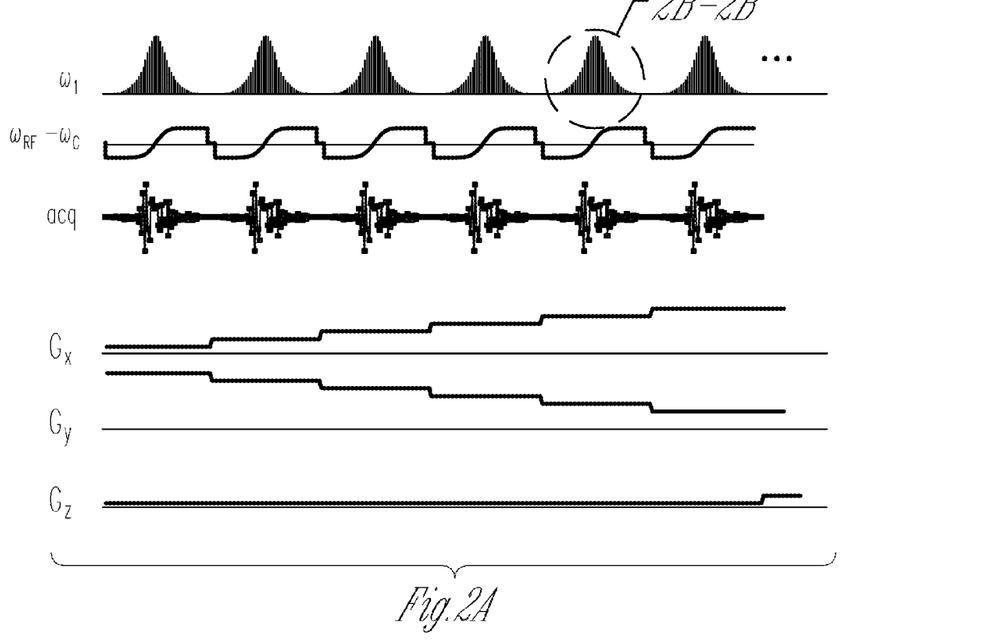
FIGS. 2A, 2B, and 2C include diagrams for a pulse sequence for SWIFT according to one example.
Figure 2B:
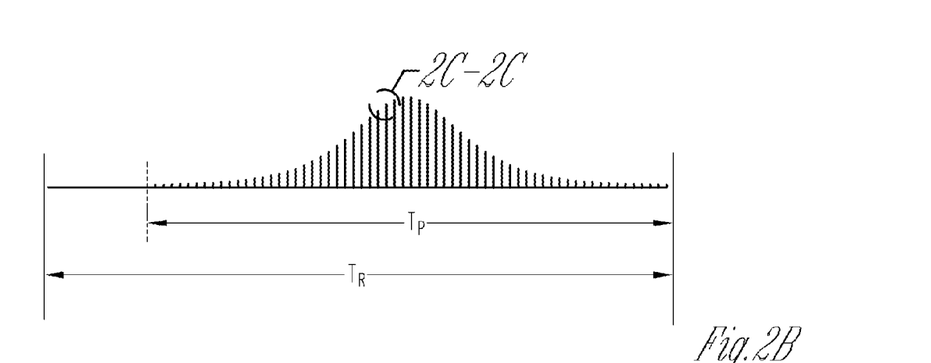
Figure 2C:
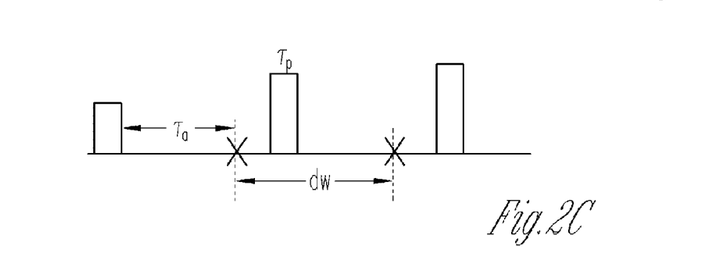

SWIFT can be modeled by the method presented in FIG. 2A. SWIFT employs a sequence of frequency-modulated pulses with short repetition time TR that exceeds the pulse length $T_P$ by at least the amount of time needed for setting a new value (or orientation) of a magnetic field gradient used to encode spatial information. The images are processed using 3D back-projection reconstruction. In one example, a frequency-modulated pulse from the hyperbolic secant family (HSn) is used. In FIG. 2B, one shaped pulse is represented which includes N different sub-pulse elements with time-dependent amplitudes and phases. During the FM pulse, an isochromat follows the effective RF field vector until the instant resonance is attained. At resonance, the isochromat is released from the RF pulse's "hug" and thereafter almost freely precesses with a small decaying modulation, yielding spectral contamination. Thus, to extract spectral information from such a spin system response, processing is performed using a cross-correlation method similar to the method of recovering phase information in stochastic NMR. The theoretically achievable signal-to-noise ratio (SNR) per unit time for SWIFT for TR<<$T_1$ is the same as that for pulsed FT. During SWIFT acquisition, the applied imaging gradients usually exceed all intrinsic gradients due to susceptibility or inhomogeneity. For this condition the images obtained are fully independent of transverse relaxation and signal intensity depends only on $T_1$ and spin density. The maximum $T_1$ contrast depends on effective flip angle and the best compromise between sensitivity and contrast will have flip angles exceeding two times the Ernst angle. If flip angles are very small, $T_1$ contrast is negligible, and contrast comes entirely from spin density. Other kinds of contrast can be reached by an appropriate preparation sequence prior to or interleaved with the image acquisition.

SWIFT provides novel and beneficial properties for MRI, including the following:

(a) fast: SWIFT eliminates the delays associated with refocusing pulses or gradient inversion, and also time for an excitation pulse, which is integrated with the acquisition period. As in other fast imaging sequences, SWIFT is limited by existing imaging system hardware and chosen compromise between acquisition speed, spatial resolution and SNR.

(b) sensitive to short $T_2$: SWIFT is sensitive to excited spins having $T_2$>1/SW (SW=spectral width). To be specifically resolved, $T_2$>N/SW must be satisfied, which is theoretically feasible even for solid objects by increasing SW.

(c) reduced motion artifacts: Because SWIFT has no "echo time" it is less sensitive to motion artifacts. It loses less signal due to either diffusion in the presence of a gradient or uncompensated motion than other fast sequences.

(d) reduced dynamic range requirement: Because the different frequencies are excited sequentially the resulting signal is distributed in time with decreased amplitude of the acquired signal. This allows more effective utilization of the dynamic range of the digitizer.

(e) quiet: SWIFT uses a small step when changing gradients between projections, and thus, fast gradient switching that creates loud noise can be avoided. SWIFT can also be operated in rapid updated mode to reach high temporal resolution in dynamic studies. This pseudo-temporal resolution is possible because projection reconstruction, unlike Fourier imaging, samples the center of k-space with every acquisition.

Part 3

Figure 3:
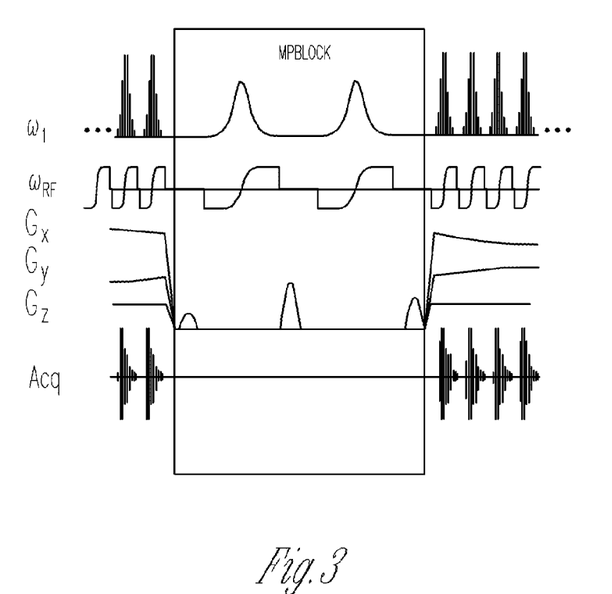
FIG. 3 illustrates an MP block interleaved in a SWIFT sequence.

Magnetization preparation (MP) can be used to generate contrast in an image. In SWIFT, the steady state can be interrupted briefly to introduce an MP block as shown in FIG. 3. The MP block, in the example shown, includes an adiabatic HS4 R10 pulse for inversion preparation. However, MP-SWIFT can be implemented using other types of pulses, including those that satisfy the adiabatic condition as well as pulses that do not. FIG. 3 illustrates a $T_2$-MP-SWIFT sequence including two HS4 R10 pulses interleaved between 512 SWIFT views.

For example, two or more adiabatic pulses can be used in the MP block. In such an example, a first pulse provides inversion recovery and a second pulse provides $T_2$ contrast.

Furthermore, post-processing techniques can yield good contrast. In one example, a processor is used to calculate a ratio of images, thus, providing contrast. The ratio, akin to normalizing, can remove certain variations in the image.

Part 4

This portion describes MP-SWIFT using adiabatic inversion preparation for quiet, $B_1$ insensitive $T_1$ weighted imaging.

SWIFT (Sweep Imaging with Fourier Transform) is a radial imaging sequence that utilizes gapped frequency-swept pulse excitation and nearly simultaneous signal acquisition in the gaps between pulse elements, as described elsewhere in this document. Because acquisition occurs "inside" the gapped pulse, SWIFT has an intrinsically short dead-time, using typical hardware-limited to ~3-15 μs. This provides sensitivity to very fast relaxing spins, similar to that achieved by UTE (Ultra-short TE) sequences.

This document describes addition of a magnetization preparation (MP) segment interleaved with views of the SWIFT readout. The MP segment in SWIFT provides high-resolution clinical-quality proton-density and adiabatic inversion magnetization prepared $T_1$-weighted images at 62.5 kHz bandwidth in human brain.

Example

MP-SWIFT can be implemented using a 4 T research MRI scanner (Oxford 90 cm bore magnet, Siemens Sonata 4 gauss/cm gradients, Varian Inova console, vnmrj "classic" interface). In the example for which data is provided herein, the MP-SWIFT sequence utilizes an adiabatic HS4 R10 pulse for inversion preparation followed by a gapped HS1 based SWIFT readout. The adiabatic inversion preparation is inserted every 256 spoke views of the SWIFT readout (total 96,000 radial k-space spokes).

Head imaging can be performed using a custom "long" quadrature input-output TEM circularly polarized transceiver head coil having very low short $T_2$ background signal. An example of such a head coil is sometimes referred to as a transverse electromagnetic (TEM) head coil.

In one example at 4 T, the SWIFT imaging sequence is limited to 62.5 kHz bandwidth when using the TEM head coil, due to ring-down and $B_1$ performance trade-offs. Good SNR and reduced ring-down can be achieved using an Echo-tek digital receiver.

Results

Figure 4A:
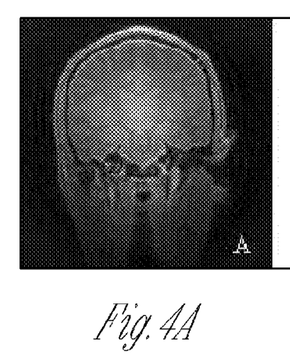
FIGS. 4A, 4B, and 4C illustrate images of a subject.
Figure 4B:
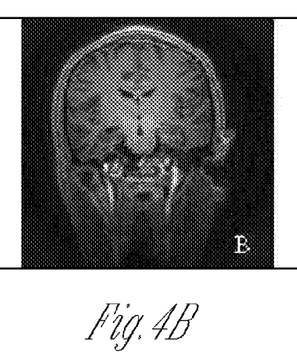
Figure 4C:
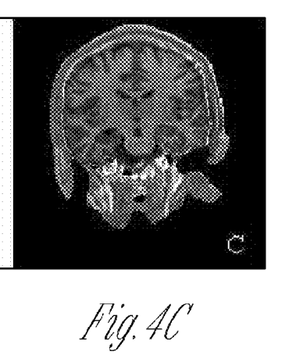

FIGS. 4A, 4B, and 4C illustrate representative performance. FIG. 4A illustrates an unfiltered slice from a SWIFT sequence. FIG. 4B illustrates MP-SWIFT and FIG. 4C illustrates a ratio of MP-SWIFT/SWIFT for a normal adult human head. The images in this series exhibit short $T_2$ signal. The contrast is dominated by longer $T_2$ signal. FIG. 4A includes a standard 2° flip, TR=4.9 ms, 8-minute, 96,000 unique radial fid view (spoke) SWIFT dataset reconstructed to 256×265×256 isotropic nominal resolution using gridding software. FIG. 4B includes the same nominal slice with MP-SWIFT, TI=1.1 s and no additional recovery time other than 256 views of SWIFT readout (about 1.25 s), with imaging time of 14 minutes, and all other parameters unchanged. FIG. 4C illustrates the ratio MP-SWIFT/SWIFT which removes intensity variations due to the SWIFT readout as well as $B_1$ variations. $B_1$ insensitivity is particularly beneficial at very high fields.

Among other differences, the SWIFT sequence is acoustically quieter than a comparable sequence. For example, SWIFT is 50 dB quieter than 3D Cartesian $T_1$-weighted FLASH of similar bandwidth using a 4 T scanner. Absolute sound intensity is approximately 55 dB (normal conversation is approximately 70 dB) compared to 104 dB for FLASH. Accordingly, SWIFT can be utilized without need of ear protection. The MP-SWIFT preparation adds some noise; however, the gradient ramping can be made smoother since the timing is not critical.

By way of summary, the figures depict the following:

FIG. 4A: SWIFT 3d isotropic $256^3$ 8 min. 62.5 kHz bandwidth. Dead time ~3-5 µs. TR is 4.9 ms. Flip angle is 2°.

FIG. 4B: MP-SWIFT 3d isotropic 14 min. Preparation is adiabatic inversion recovery. TI (tau) is 1.1 s every 256 SWIFT views.

FIG. 4C: Ratio Image, MP-SWIFT/SWIFT; Contrast is entirely determined by preparation. $B_1$ effects on contrast and intensity are removed.

Discussion

Unlike RAGE, SWIFT performs excitation simultaneously with acquisition. This favors the choice of preparations which leave the magnetization in the longitudinal state. Other standard preparation-excitation combinations can be used with a flip-back. SWIFT and MP-SWIFT can be used for imaging of pediatric and phobic patients.

Accordingly, 4 T head imaging can be performed using MP-SWIFT for $T_1$ contrast.

Part 5

This portion describes adiabatic $T_2$ weighted MP-SWIFT in brain at 4 T.

This document describes an adiabatic double-inversion magnetization preparation (MP) segment interleaved with views of the SWIFT readout. The present subject matter provides high-resolution clinical-quality $T_2$-weighted images at 62.5 kHz bandwidth in human brain using $T_2$-MP-SWIFT.

Example $T_2$-MP-SWIFT can be implemented using a 4 T research MRI scanner. The MP block is schematically depicted in FIG. 3. $T_2$-MP-SWIFT utilizes two adiabatic HS4 R10 pulses for double-inversion preparation followed by a gapped HS1-based SWIFT readout. The adiabatic double-inversion preparation is inserted every 512 spoke views of the SWIFT readout (total 96,000 radial k-space spokes).

Head imaging can be performed using a custom "long" quadrature input-output TEM circularly polarized TEM head coil having a very low short $T_2$ background signal.

As noted elsewhere in this document, the SWIFT imaging sequence is limited at 4 T to 62.5 kHz bandwidth when using the TEM head coil.

Results

Figure 5A:
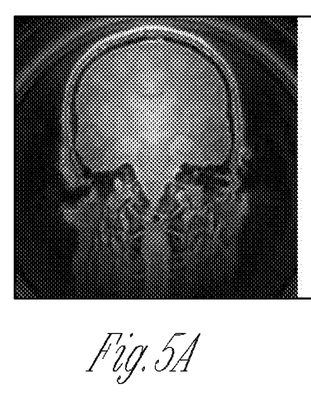
FIGS. 5A and 5B illustrate images of a subject.
Figure 5B:
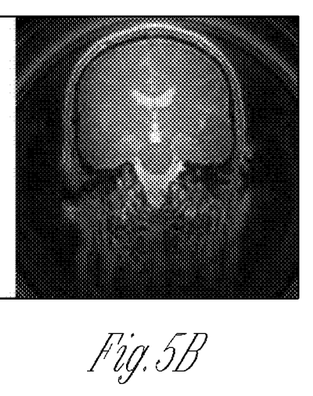

FIGS. 5A and 5B illustrate representative slices from SWIFT (FIG. 5A) and from $T_2$-MP-SWIFT (FIG. 5B) for a normal adult human head. The $T_2$-MP-SWIFT image includes some recovered short $T_2$ signal, the contrast is dominated by long $T_2$ signal. FIG. 5A includes a standard 2° flip, 62.5 kHz, TR=4.9 ms, 8-minute, 96,000 unique radial fid view (spoke) SWIFT dataset reconstructed to 256×265×256 isotropic nominal resolution by gridding software. FIG. 5B includes the same nominal slice with $T_2$-MP-SWIFT, using two 30 ms HS4 R10 180° pulses, there is no additional recovery time other than 512 views of SWIFT readout (about 2.5 s), with imaging time of slightly over 8 minutes, and all other parameters remain unchanged.

The SWIFT sequence is substantially quieter than 2D or 3D Cartesian $T_2$-weighted sequence of similar bandwidth using a 4 T scanner. While no ear protection is necessary with a SWIFT-only MRI session, the $T_2$-MP-SWIFT preparation adds some noise; however, the gradient ramping can be made smoother since the timing is not critical.

By way of summary, the figures illustrate the following:

FIG. 5A: SWIFT 3D isotropic $256^3$ 8 min. 62.5 kHz bandwidth. Dead time ~3-5 µs. TR is 4.9 ms. Flip angle is 2°.

FIG. 5B: $T_2$-MP-SWIFT 3D, 8 min. Preparation is double adiabatic inversion. (60 ms total) every 512 SWIFT views.

Discussion

The image contrast is adiabatic $T_{1\rho}$ which has $T_1$- and $T_2$-like components. Unlike other imaging sequences, SWIFT performs excitation substantially simultaneously with acquisition. This favors the choice of preparations which leave the magnetization in the longitudinal state. Other standard preparation-excitation combinations can be used with a flip-back. As with MP-SWIFT, $T_2$-MP-SWIFT may be beneficial for imaging of pediatric and phobic patients.

Accordingly, 4 T head imaging can be conducted using MP-SWIFT for $T_2$ contrast.

Part 6

Figure 6:
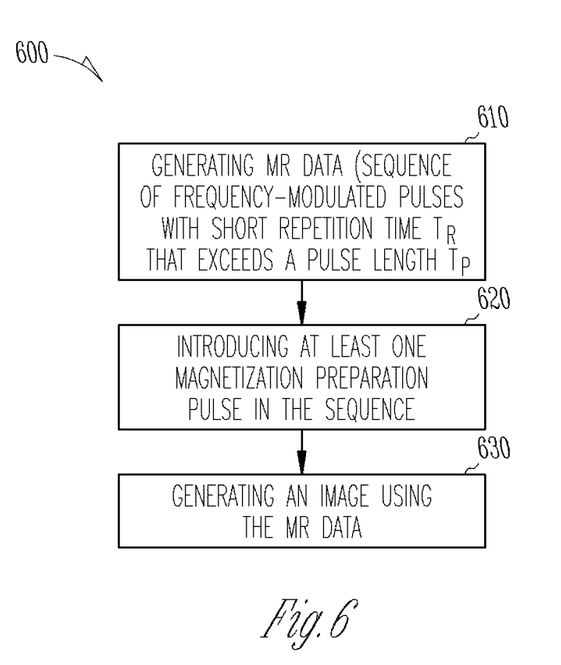
FIG. 6 includes a flow chart of a method according to one example.

The following describes method 600 according to one example, as shown in FIG. 6.

At 610, method 600 includes generating MR data using a sequence of frequency-modulated pulses with short repetition time TR that exceeds a pulse length $T_P$.

At 620, method 600 includes introducing at least one magnetization preparation pulse in the sequence. The magnetization pulse is interleaved with the excitation pulse.

At 630, method 600 includes generating an image using the MR data.

Additional Notes

Various adiabatic pulse profiles can be used in the present subject matter, including, for example, HS1, HS4, HS8, HSn, and BIR4 ($B_1$ independent refocusing). An adiabatic pulse is both amplitude modulated and frequency modulated and satisfies the adiabatic condition. In addition to an adiabatic pulse, the present subject matter can be implemented using a non-adiabatic preparation pulse. An adiabatic preparation pulse can be used to avoid destruction of $T_2$.

A preparation pulse can be interleaved within a sequence of other pulses. For example, a preparation pulse can be interleaved within a SWIFT sequence. In addition, a preparation pulse can be periodic or aperiodic.

Sequence examples can be described using a notation in which S denotes SWIFT and $P_n$, denotes a preparation pulse n. As such, the present subject matter can be implemented using any of the following representative sequences:

$P_1$SSSS $P_1$SSSS $P_1P_2$SSSS $P_1$SSSS $P_1$ $P_2$
$P_1$SSSS $P_2$SSSS $P_1$SSSS $P_2$
$P_1$SS $P_1$SS $P_1$SS

In general, the preparation pulse can include an inverted pulse, a fat suppression (FS) pulse or an interleaved FS and water suppression (WS). In addition, a sequence can include one, two, three or more pulses per preparation. The preparation pulse can be staggered or periodic.

An example of the present subject matter can be used for short $T_2$ preserving preparations and for long $T_2$ suppressing preparations. Accordingly, the present subject matter is suitable for fat suppression or water suppression (preserves short $T_2$).

A combined $T_1$-weighted and $T_2$-weighted image can be produced using the present subject matter with suitable selection of a flip-back/flip-down pulse.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A system comprising:
a magnetic resonance scanner; and
a processor coupled to the scanner and configured to provide an excitation sequence to a sample, the excitation sequence including a gapped pulse having swept frequency and swept amplitude, the processor configured to interleave at least one magnetization preparation pulse in the excitation sequence, and configured to acquire spin system data for use in generating an image.

2. The system of claim 1 wherein the magnetic resonance scanner includes an inhomogeneous magnet.

3. The system of claim 1 wherein the processor is configured to provide at least one adiabatic pulse.

4. The system of claim 1 wherein the at least one magnetization preparation pulse includes a hyperbolic secant pulse.

* * * * *

UNITED STATES PATENT AND TRADEMARK OFFICE
CERTIFICATE OF CORRECTION

PATENT NO. : 8,502,537 B2
APPLICATION NO. : 12/752633
DATED : August 6, 2013
INVENTOR(S) : Corum et al.

It is certified that error appears in the above-identified patent and that said Letters Patent is hereby corrected as shown below:

On the title page, in item (54), in "Title", and in the Specification, in column 1, line 2, delete "B1 AND B0" and insert --$B_1$ AND $B_0$--, therefor On title page 2, in column 1, under "Other Publications", line 4, delete "C A," and insert --C. A.,--, therefor On title page 2, in column 1, under "Other Publications", line 6, delete "C A," and insert --C. A.,--, therefor On title page 2, in column 1, under "Other Publications", line 7, delete "B1" and insert --$B_1$--, therefor On title page 2, in column 1, under "Other Publications", line 7, delete "T1" and insert --$T_1$--, therefor On title page 2, in column 1, under "Other Publications", line 15, delete "D," and insert --D.,--, therefor On title page 2, in column 2, under "Other Publications", line 1, delete "Ti-based" and insert --$T_1$-based--, therefor In the Drawings Sheet 3 of 4, Fig. 3, delete "MPBLOCK" and insert --MP BLOCK--, therefor Sheet 4 of 4, Fig. 6, after "$T_P$", insert --)--, therefor In the Specification In column 1, line 11, delete "B1" and insert --$B_1$--, therefor Signed and Sealed this
Eleventh Day of November, 2014

Michelle K. Lee
*Deputy Director of the United States Patent and Trademark Office*

CERTIFICATE OF CORRECTION (continued)
U.S. Pat. No. 8,502,537 B2

In column 1, line 18-21, delete "This invention was made with government support under award number BTRR P 41 RR008079 from the National Institutes of Health (NIH). The government has certain rights in this invention." and insert --This invention was made with government support under P41-RR008079 awarded by the National Institutes of Health. The government has certain rights in the invention.--, therefor In column 3, line 32, delete "TR" and insert --$T_R$--, therefor In column 3, line 50, delete "TR" and insert --$T_R$--, therefor In column 5, line 24, delete "TR" and insert --$T_R$--, therefor In column 5, line 47, delete "TR" and insert --$T_R$--, therefor In column 6, line 28, delete "TR" and insert --$T_R$--, therefor In column 6, line 64, delete "TR" and insert --$T_R$--, therefor In column 7, line 19, delete "$P_n$," and insert --$P_n$--, therefor

UNITED STATES PATENT AND TRADEMARK OFFICE
CERTIFICATE OF CORRECTION

| | |
|---|---|
| PATENT NO. | : 8,502,537 B2 |
| APPLICATION NO. | : 12/752633 |
| DATED | : August 6, 2013 |
| INVENTOR(S) | : Corum et al. |

It is certified that error appears in the above-identified patent and that said Letters Patent is hereby corrected as shown below:

On the title page, in item (54), in "Title", and in the Specification, in column 1, line 2, delete "B1 AND B0" and insert --$B_1$ AND $B_0$--, therefor On the title page, in the illustrative figure, "MPBLOCK" should read --MP BLOCK--.

On title page 2, in column 1, under "Other Publications", line 4, delete "C A," and insert --C. A.,--, therefor On title page 2, in column 1, under "Other Publications", line 6, delete "C A," and insert --C. A.,--, therefor On title page 2, in column 1, under "Other Publications", line 7, delete "B1" and insert --$B_1$--, therefor On title page 2, in column 1, under "Other Publications", line 7, delete "T1" and insert --$T_1$--, therefor On title page 2, in column 1, under "Other Publications", line 15, delete "D," and insert --D.,--, therefor On title page 2, in column 2, under "Other Publications", line 1, delete "Ti-based" and insert --$T_1$-based--, therefor In the Drawings Sheet 3 of 4, Fig. 3, delete "MPBLOCK" and insert --MP BLOCK--, therefor Sheet 4 of 4, Fig. 6, after "$T_P$", insert --)--, therefor This certificate supersedes the Certificate of Correction issued November 11, 2014.

Signed and Sealed this
Ninth Day of December, 2014

Michelle K. Lee
*Deputy Director of the United States Patent and Trademark Office*

In the Specification

In column 1, line 11, delete "B1" and insert --$B_1$--, therefor

In column 1, line 18-21, delete "This invention was made with government support under award number BTRR P 41 RR008079 from the National Institutes of Health (NIH). The government has certain rights in this invention." and insert --This invention was made with government support under P41-RR008079 awarded by the National Institutes of Health. The government has certain rights in the invention.--, therefor In column 3, line 32, delete "TR" and insert --$T_R$--, therefor In column 3, line 50, delete "TR" and insert --$T_R$--, therefor In column 5, line 24, delete "TR" and insert --$T_R$--, therefor In column 5, line 47, delete "TR" and insert --$T_R$--, therefor In column 6, line 28, delete "TR" and insert --$T_R$--, therefor In column 6, line 64, delete "TR" and insert --$T_R$--, therefor In column 7, line 19, delete "$P_n$," and insert --$P_n$--, therefor